(12) United States Patent
Hwang (10) Patent No.: US 11,121,411 B2
(45) Date of Patent: Sep. 14, 2021

(54) BATTERY PACK AND METHOD FOR DETECTING WHETHER OR NOT BUSBAR IS OPENED USING THE BATTERY PACK

(71) Applicant: SK Innovation Co., Ltd., Seoul (KR)

(72) Inventor: Kyu Min Hwang, Daejeon (KR)

(73) Assignee: SK Innovation Co., Ltd., Seoul (KR)

( * ) Notice: Subject to any disclaimer, the term of this patent is extended or adjusted under 35 U.S.C. 154(b) by 308 days.

(21) Appl. No.: 15/889,417

(22) Filed: Feb. 6, 2018

(65) Prior Publication Data
US 2018/0226690 A1 Aug. 9, 2018

(30) Foreign Application Priority Data

Feb. 6, 2017 (KR) .................. 10-2017-0016365

(51) Int. Cl.
*H01M 10/42* (2006.01)
*H02J 7/00* (2006.01)
*H01M 50/20* (2021.01)
*G01R 31/385* (2019.01)
*H01M 50/502* (2021.01)

(52) U.S. Cl.
CPC ....... *H01M 10/4207* (2013.01); *H01M 50/20* (2021.01); *H02J 7/0016* (2013.01); *H02J 7/0026* (2013.01); *G01R 31/385* (2019.01); *H01M 50/502* (2021.01); *H01M 2220/20* (2013.01)

(58) Field of Classification Search
CPC ........... H01M 10/4207; H01M 2/1077; H01M 2/206; H02J 7/0016; H02J 7/0026
See application file for complete search history.

(56) References Cited

U.S. PATENT DOCUMENTS

| | | | | |
|---|---|---|---|---|
| 4,589,966 A | * | 5/1986 | Ford | .......................... C25B 9/66 205/345 |
| 2008/0314657 A1 | * | 12/2008 | Ikeda | .................. H01M 2/1077 180/65.1 |
| 2015/0207131 A1 | * | 7/2015 | Han | ...................... H01M 2/345 429/61 |
| 2015/0243957 A1 | | 8/2015 | Han et al. | |

FOREIGN PATENT DOCUMENTS

| CN | 102025262 A | * | 4/2011 |
|---|---|---|---|
| JP | 5626407 B2 | | 11/2014 |
| KR | 1020150099193 A | | 8/2015 |
| KR | 1020160067599 A | | 6/2016 |

OTHER PUBLICATIONS

Zhangfeng Deng et al., CN 102025262 Translated, EPO Translation May 28, 2020, Published Apr. 20, 2011 (Year: 2011).*

* cited by examiner

*Primary Examiner* — Jimmy Vo
(74) *Attorney, Agent, or Firm* — The Webb Law Firm (57) ABSTRACT

Provided is a battery pack including a busbar connection state protection circuit that detects an opening of a busbar when the busbar that connects between unit batteries is opened by damage and prevents a problem in that a reverse voltage generated when the busbar is damaged damages a battery management board. Provided is also a method for detecting whether or not a busbar is opened using the battery pack, capable of easily detecting whether or not the busbar is opened using the battery pack.

7 Claims, 8 Drawing Sheets

BATTERY PACK AND METHOD FOR DETECTING WHETHER OR NOT BUSBAR IS OPENED USING THE BATTERY PACK

CROSS-REFERENCE TO RELATED APPLICATION

This application claims priority to Korean Patent Application No. 10-2017-0016365 filed Feb. 6, 2017, the disclosure of which is hereby incorporated in its entirety by reference.

TECHNICAL FIELD

The following disclosure relates to a battery pack including a busbar connection state protection circuit for detecting a busbar open and preventing a reverse voltage, and a method for detecting whether or not a busbar is opened using the battery pack.

BACKGROUND

As an environmental pollution problem recently becomes increasingly serious, attempts have been made to reduce the use of fossil fuel and to use alternative power source in various fields. As one example, in the field of vehicles, electric vehicles or hybrid vehicles that simultaneously use fossil fuel and electricity to reduce the use of fossil fuel are developed and commercialized.

In order to operate such an electric vehicle, a very high capacity of battery pack is required, and such a battery pack includes unit batteries and busbars that electrically connect the unit batteries to each other. In general, the busbar is formed in a form of a bar made of a metal conductor, and is connected to electrodes of the unit batteries by a screw coupling or the like.

Figure 1:
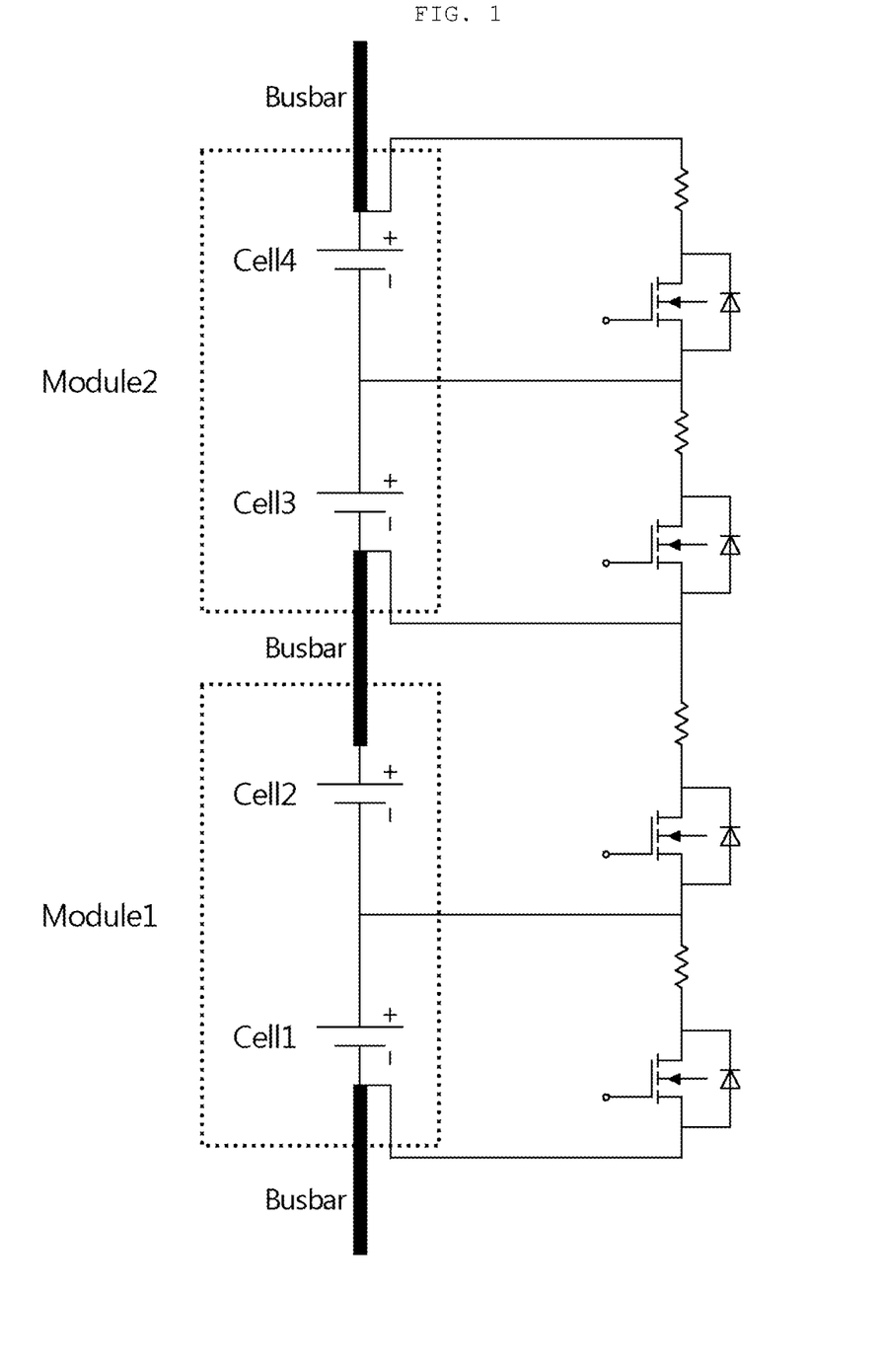
FIG. 1 is a circuit diagram of a battery pack including unit batteries and busbars that connect the unit batteries to each other.

FIG. 1 illustrates a simple circuit diagram of a battery pack including the unit batteries and the busbars that connect the unit batteries to each other as described above. Each of the unit batteries (Cell 1, 2, 3, 4) includes a balancing circuit, a small number of unit batteries form a module (Module 1, 2), and such modules are connected to each other by the busbar.

As described above, the busbar is generally connected to the electrode by screw coupling or the like. Meanwhile, it is inevitable that external vibration continuously occurs due to operation characteristics of the vehicle, and in such a case, the screw is loosened by such vibration. As such, when the connection of the busbar is disconnected and the busbar is unexpectedly opened, not only the electrical connection between the modules is disconnected, but also the following problems occur.

Figure 2:
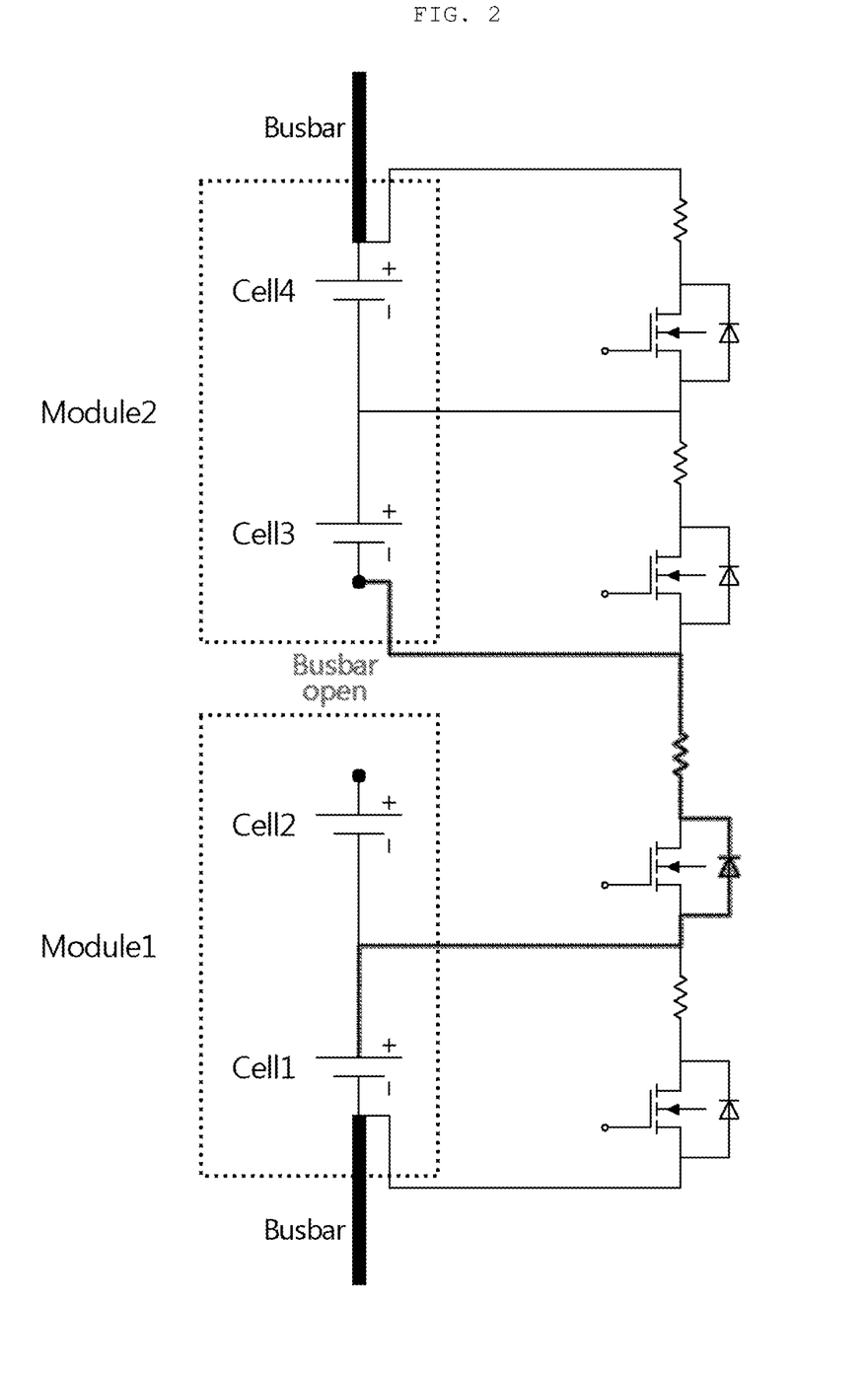
FIG. 2 is a circuit diagram of a state in which a middle busbar in the battery pack of FIG. 1 is opened.
Figure 3A:
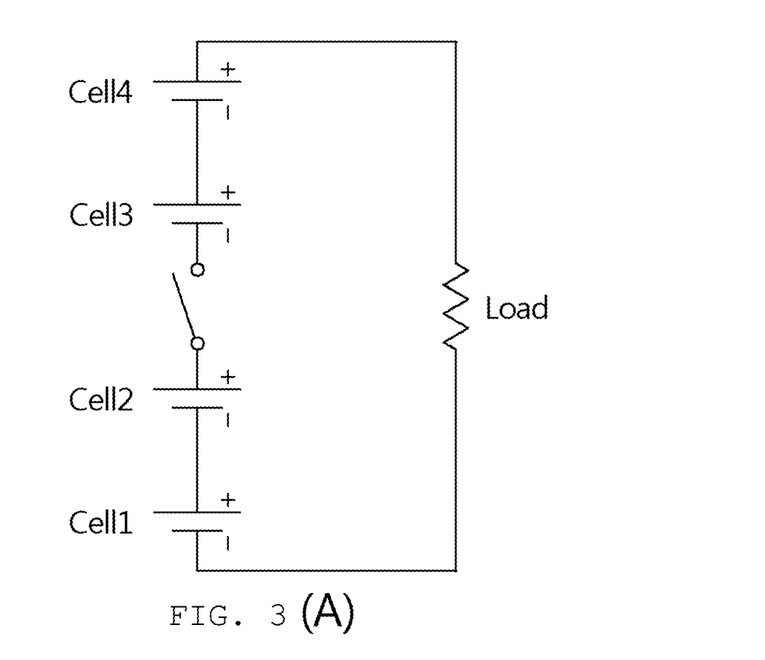
FIGS. 3A and 3B are equivalent circuits in which a reverse voltage is formed when the busbar is opened.
Figure 3B:
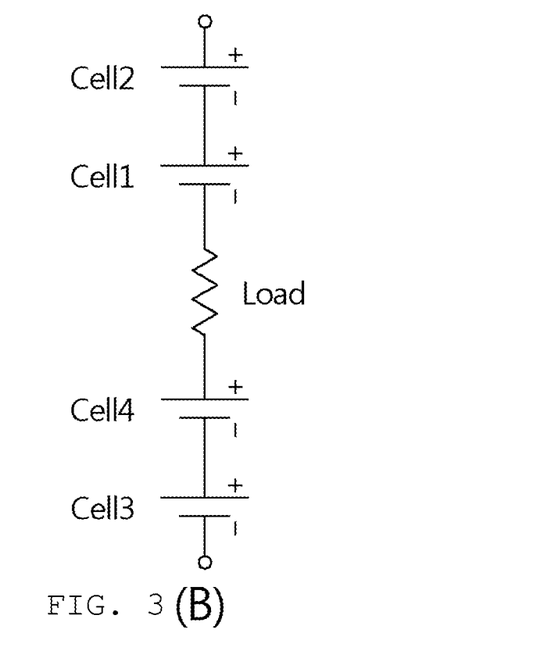

FIG. 2 illustrates a circuit diagram of a state in which a middle busbar in the battery pack of FIG. 1 is opened. Since the busbar is included in a balancing path of the unit battery in an original circuit as illustrated, a current flows as indicated by a bolded line of FIG. 2 when the busbar is unexpectedly opened. That is, a high current that needs to flow to the busbar flows to the balancing path and a reverse voltage relationship is formed, thereby causing a problem of damaging a battery management board. FIG. 3 illustrates an equivalent circuit in which a reverse voltage is formed when the busbar is opened.

Various types of apparatuses are disclosed to protect a system from an occurrence of an overcurrent. As one example, Korean Patent Laid-Open Publication No. 2015-0099193 ("Secondary battery module", hereinafter, referred to as the related art) discloses a secondary battery module including unit battery cells which are connected in parallel to each other by a busbar. In the related art, in addition to the busbar that connects the electrodes in parallel to each other, an external fuse is further connected in parallel between the electrodes, such that the current flows to the external fuse when the overcurrent flows, thereby quickly melting and disconnecting the external fuse.

In the technology according to the related art, the path in which the current flows is merely disconnected using the fuse and the unit batteries are connected in parallel to each other in the related art, while in the case of a problem to be solved herein, the unit batteries are connected in series with each other and a circuit configuration itself is entirely different from the related art. That is, it is difficult to solve the problem in that the current flows to the balancing circuit when the busbar is opened and the reverse voltage is formed as described above, and the problem of damaging the battery management board accordingly, by the technology according to the related art.

As such, in the case in which a plurality of unit batteries each including a balancing circuit are connected in series with each other by a busbar, there is a demand for a new configuration capable of solving the occurrence of the reverse voltage caused when the busbar is opened and the system damage accordingly.

RELATED ART DOCUMENT

Patent Document

1. Korean Patent Laid-Open Publication No. 2015-0099193 ("Secondary battery module")

SUMMARY

An embodiment of the present invention is directed to providing a battery pack including a busbar connection state protection circuit that detects an opening of a busbar when the busbar that connects between unit batteries is opened by damage and prevents a problem in that a reverse voltage generated when the busbar is damaged damages a battery management board. Another embodiment of the present invention is directed to providing a method for detecting whether or not a busbar is opened using the battery pack, capable of easily detecting whether or not the busbar is opened using the battery pack.

In one general aspect, a battery pack including a busbar connection state protection circuit for detecting an opening of a busbar and preventing a reverse voltage includes: a plurality of modules including a unit battery which is connected in parallel to a balancing circuit, the module including a single unit battery or a plurality of unit batteries which are connected in series with each other; at least one busbar having one terminal connected to a cathode of one module and the other terminal connected to an anode of the other adjacent module to connect adjacent modules in series with each other; and a protective resistor connected in parallel to the busbar.

When the busbar is opened, the battery pack may be formed so that electricity flows from the cathode of one module to the anode of the other adjacent module through the protective resistor.

When a plurality of protective resistors are provided, resistance values of the respective protective resistors may be formed to be equal to each other or be formed to be different from each other.

In another general aspect, a method for detecting whether or not a busbar is opened using a battery pack including a busbar connection state protection circuit detects whether or not the busbar is opened using the battery pack as described above, and includes: an operation of connecting a voltage detection circuit of connecting both terminals of a module assembly in which the plurality of modules are connected in series with each other, and both terminals of a first resistor and a second resistor which are connected in series with each other to each other; an operation of sensing a voltage value of sensing the voltage value between the first resistor and the second resistor; and an operation of determining whether or not a busbar is opened of determining whether or not the busbar is opened using the voltage value sensed in the operation of sensing the voltage value.

In the operation of determining whether or not the busbar is opened, when the first resistor is disposed at an anode side of the module assembly and the second resistor is disposed at a cathode side of the module assembly, it may be determined that the busbar is normally connected when the voltage value sensed in the operation of sensing the voltage value satisfies:

$$V = Vpack * R1/(R1+R2).$$

(where, V: the sensed voltage value, Vpack: a sum of voltage values across each of the modules included in the module assembly, R1: a resistance value of the first resistor, and R2: a resistance value of the second resistor)

In the operation of determining whether or not the busbar is opened, when the first resistor is disposed at an anode side of the module assembly, the second resistor is disposed at a cathode side of the module assembly, and at least some of the busbars included in the module assembly are opened, it may be determined that the busbar is opened when the voltage value sensed in the operation of sensing the voltage value satisfies:

$$V = Vpack * R1/(R1+R2+\Sigma R0).$$

(where, V: the sensed voltage value, Vpack: a sum of voltage values across each of the modules included in the module assembly, R1: a resistance value of the first resistor, R2: a resistance value of the second resistor, and $\Sigma R0$: a sum of resistance values of the protective resistors corresponding to busbar opened positions)

In the operation of determining whether or not the busbar is opened, when the order of the protective resistors is sequentially 1, ..., N from the anode side of the module assembly to the cathode side thereof, a resistance value of an N-th protective resistor may be determined to be $2^{N-1}R$, and it may be determined that the busbars of digits at which 1 is generated when the value of $\Sigma R0$ calculated from the voltage value sensed in the operation of sensing the voltage value is transformed to the binary number*R are opened.

DETAILED DESCRIPTION OF MAIN ELEMENTS

R1: first resistor R2: second resistor
R0: protective resistor

DETAILED DESCRIPTION OF EMBODIMENTS

Hereinafter, a battery pack including a busbar connection state protection circuit for detecting an opening of a busbar and preventing a reverse voltage according to the present invention having the configuration as described above, and a method for detecting whether or not a busbar is opened using the battery pack will be described in detail with reference to the accompanying drawings.

Figure 4:
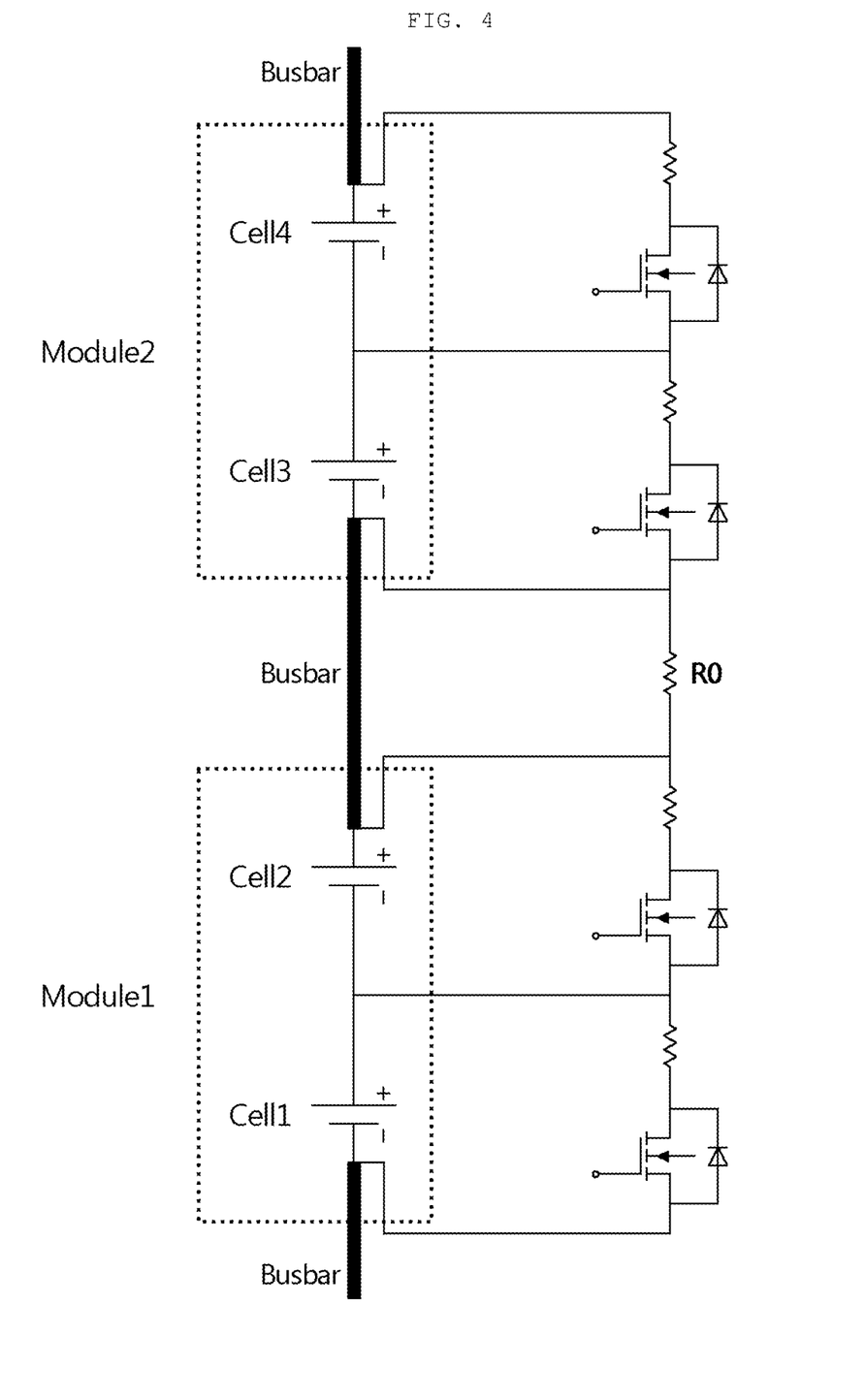
FIG. 4 illustrates a battery pack including a busbar connection state protection circuit for detecting the opening of the busbar and preventing a reverse voltage.

Battery Pack Including Busbar Connection State Protection Circuit According to the Present Invention FIG. 4 illustrates a circuit diagram of a battery pack including a busbar connection state protection circuit for detecting the opening of the busbar and preventing a reverse voltage. As illustrated, the battery pack according to the present invention basically includes a plurality of modules, at least one busbar that connects the plurality of modules to each other, and a protective resistor which is connected in parallel to the busbar. Hereinafter, the respective units will be described in more detail.

The module includes unit batteries, and each of the unit battery is connected in parallel to a balancing circuit. The module may also include a single unit battery, and may also include a plurality of unit batteries. In a case in which the module includes the plurality of unit batteries, the unit batteries are connected in series with each other. FIG. 4 illustrates a case in which each of the modules (Module 1, Module 2) includes two unit batteries (Cell1, Cell2, Cell3, Cell4).

The busbar connects the modules which are adjacent to each other in series with each other. If there are two modules, only one busbar is required, and if there are three or more modules, two or more busbars are also required. A connection state between the modules and the busbar will be described in more detail. As illustrated in FIG. 4, one terminal of the busbar is connected to a cathode of the module and the other terminal thereof is connected to an anode of the other adjacent module.

Conventionally, the battery pack is formed by only the modules and at least one busbar that connects the modules in series with each other. In such a conventional battery pack, however, as described above, when the busbar is unexpectedly opened, a high current (a current of a very large value) that needs to originally flow to the busbar flows through the balancing circuit as illustrated in FIG. 2. As a result, the balancing circuit is primarily damaged, and as a result, there was a problem in that a reverse voltage relationship is formed as illustrated in FIG. 3, which seriously damages the battery management board.

In order to solve the above-mentioned problem, according to the present invention, the battery pack further includes a protective resistor R0 which is connected in parallel to the busbar, as illustrated in FIG. 4. That is, one protective resistor is provided for one busbar, and the number of protective resistors in one battery pack is the same as the number of busbars.

A connection state of the protective resistor will be described in more detail as follows. As described above, one balancing circuit is connected in parallel to one unit battery. That is, the balancing circuit is provided so that one terminal thereof is connected to a cathode of the unit battery and the other terminal thereof is connected to an anode of the unit battery. Meanwhile, the busbar connects the modules in series with each other, that is, one terminal of the busbar is connected to a cathode of one module, and the other terminal thereof is connected to an anode of the other adjacent module. Here, the protective resistor is connected in parallel to the busbar means that one terminal of the protective resistor is connected to one terminal of the balancing circuit which is connected to the cathode of the module, and the other terminal of the protective resistor is connected to the other terminal of the balancing circuit which is connected to the anode of the other adjacent module.

Figure 5:
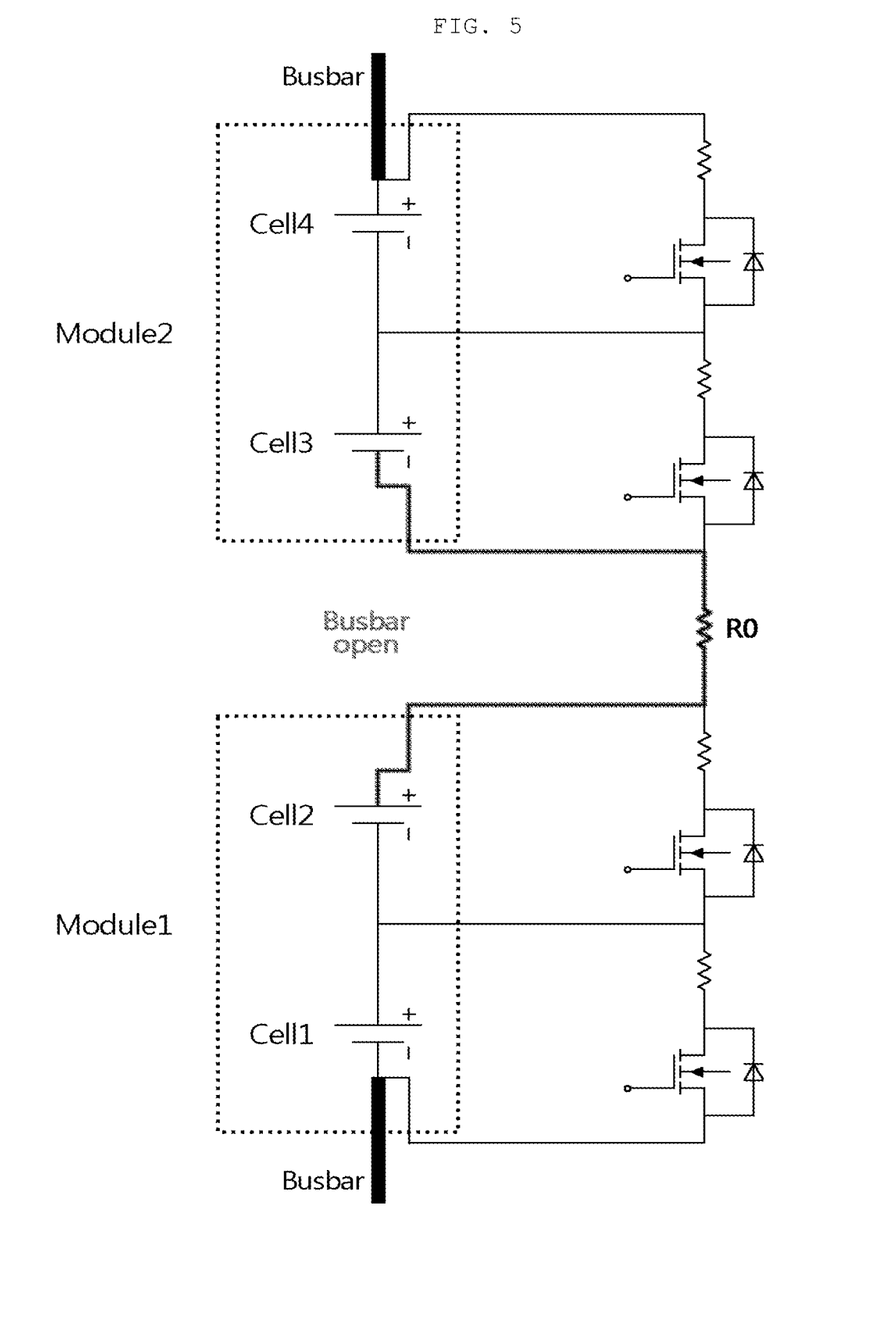
FIG. 5 is a circuit diagram of a state in which a middle busbar in the battery pack according to the present invention is opened.

That is, in the connection state as described above, the battery pack is formed so that electricity flows from the cathode of one module to the anode of the other adjacent module through the protective resistor, when the busbar is opened. FIG. 5 illustrates a circuit diagram of a state in which a middle busbar is opened in the battery pack according the present invention, and indicates a path through which the current flows when the busbar is opened by a bolded line.

In general, the busbar is treated as a wire, that is, is ideally considered as having resistance of zero. Meanwhile, the protective resistor has a relatively larger resistance value than the busbar. Therefore, in a normal state, that is, a state in which the busbar is properly connected, the current hardly flows to the protective resistor and the current flows to only the busbar. On the other hand, when the busbar is opened, all of the high current that needs to flow to the busbar flows through the protective resistor as illustrated in FIG. 5. Conventionally, since the balancing circuit is included in the path through which the high current flows when the busbar is opened, the damage on the balancing circuit has occurred, but according to the present invention, only the protective resistor is included in the path through which the high current flows and the high current does not flow to the balancing circuit as illustrated in FIG. 5, thereby making it possible to essentially prevent the conventional damage problem of the balancing circuit. The conventional problem in that the reverse voltage is formed when the busbar is opened and the problem about the damage on the battery management board accordingly may also be essentially prevented by the change of the path of the high current.

Meanwhile, FIGS. 4 and 5 illustrate a module assembly including two modules and one busbar as the simplest example, and in this case, one protective resistor (equal to the number of busbar) is also provided. However, the battery pack generally includes two or more modules, and the battery pack according to the present invention is likely to include a plurality of protective resistors, accordingly. When the plurality of protective resistors are provided as described above, resistance values of the respective protective resistors may be formed to be equal to each other or may be formed to be different from each other. Depending on how the resistance values of the protective resistors are formed, a sensed voltage value in a voltage detection circuit to be described below appears differently.

Method for Detecting Whether or not Busbar is Opened Using Battery Pack Including Busbar Connection State Protection Circuit According to the Present Invention The battery pack including the busbar connection state protection circuit according to the present invention may not only prevent the damage on the balancing circuit or the battery management board included in the battery pack by preventing the reverse voltage when the busbar is opened as described above, but also easily detect whether or not the busbar is opened on characteristics of a circuit structure thereof. Hereinafter, the method for detecting whether or not the busbar is opened using the battery pack according to the present invention may include an operation of connecting a voltage detection circuit, an operation of sensing a voltage value, and an operation of determining whether or not the busbar is opened, and the respective operations will be described in more detail below.

First, in the operation of connecting the voltage detection circuit, the voltage detection circuit is first connected to the battery pack. FIGS. 6A and 6B illustrate voltage sensing examples for each of the normal state and the busbar opened state when the voltage is sensed using the voltage detection circuit in the battery pack according to the present invention. Even if the battery pack is not necessarily the battery pack according to the present invention, as long as it is the battery pack in the normal state, that is, a state in which the busbar is not opened and is normally connected, the voltage sensing is as illustrated in FIG. 6A when the voltage detection circuit is connected thereto. That is, both terminals of the module assembly in which the plurality of modules are connected in series with each other, and both terminals of a first resistor and a second resistor which are connected in series with each other are connected to each other. Here, 'the first resistor and the second resistor which are connected in series with each other' become the voltage detection circuit.

Next, in the operation of sensing the voltage value, a voltage value between the first resistor and the second resistor is sensed in this state. Here, the voltage detection circuit is configured in a form in which the first resistor is disposed at an anode side of the module assembly and the second resistor is disposed at a cathode side of the module assembly.

Next, in the operation of determining whether or not the busbar is opened, it is determined whether or not the busbar is opened using the voltage value sensed in the operation of sensing the voltage value.

Figure 6:
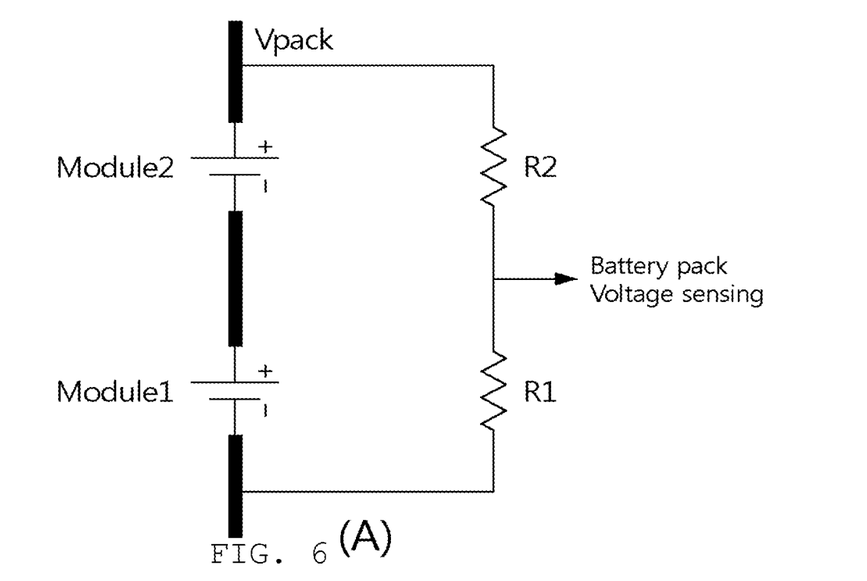
FIGS. 6A and 6B illustrate voltage sensing examples for each of the normal state and the busbar opened state when the voltage is sensed using the voltage detection circuit in the battery pack according to the present invention.

Meanwhile, FIG. 6 illustrates an example in which two modules (Module1, Module2) are connected in series with each other by a busbar. In this case, in a state in which the busbar is normally connected, an equivalent circuit appears as illustrated in FIG. 6A, and in this case, the sensed voltage value satisfies the following equation.

$$V = V\text{pack} * R1/(R1+R2)$$

(where, V: the sensed voltage value, Vpack: a sum of voltage values across each of the modules included in the module assembly, R1: a resistance value of the first resistor, and R2: a resistance value of the second resistor)

In a case in which the busbar is opened, in the battery pack according to the present invention, the high current that needs to flow to the busbar flows to the protective resistor R0, thereby changing the voltage value measured in the voltage detection circuit. That is, in the case as illustrated in FIG. 6B, the sensed voltage value satisfies the following equation.

$$V = V\text{pack} * R1/(R1+R2+R0)$$

(where, V: the sensed voltage value, Vpack: a sum of voltage values across each of the modules included in the module assembly, R1: a resistance value of the first resistor, R2: a resistance value of the second resistor, and R0: a resistance value of the protective resistor)

That is, in the case of the battery pack as illustrated in FIG. 6, in the operation of sensing the voltage value, when the sensed voltage value is Vpack*R1/(R1+R2), it may be determined that the busbar is normally connected, and when the sensed voltage value is Vpack*R1/(R1+R2+R0), it may be determined that the busbar is opened.

FIG. 6 illustrates a case in which the module assembly to which the voltage detection circuit is connected includes two modules and one busbar (connecting the two modules to each other), but the same method may also be applied to a module assembly including more modules and busbars. First, in a case in which none of the busbars are opened and the busbars are all normally connected, the voltage value sensed in the voltage detection circuit will be the same as in FIG. 6A regardless of how many modules the module assembly includes. That is, in the state in which all of the busbars are normally connected, the voltage value sensed in the voltage detection circuit is Vpack*R1/(R1+R2).

Figure 7:
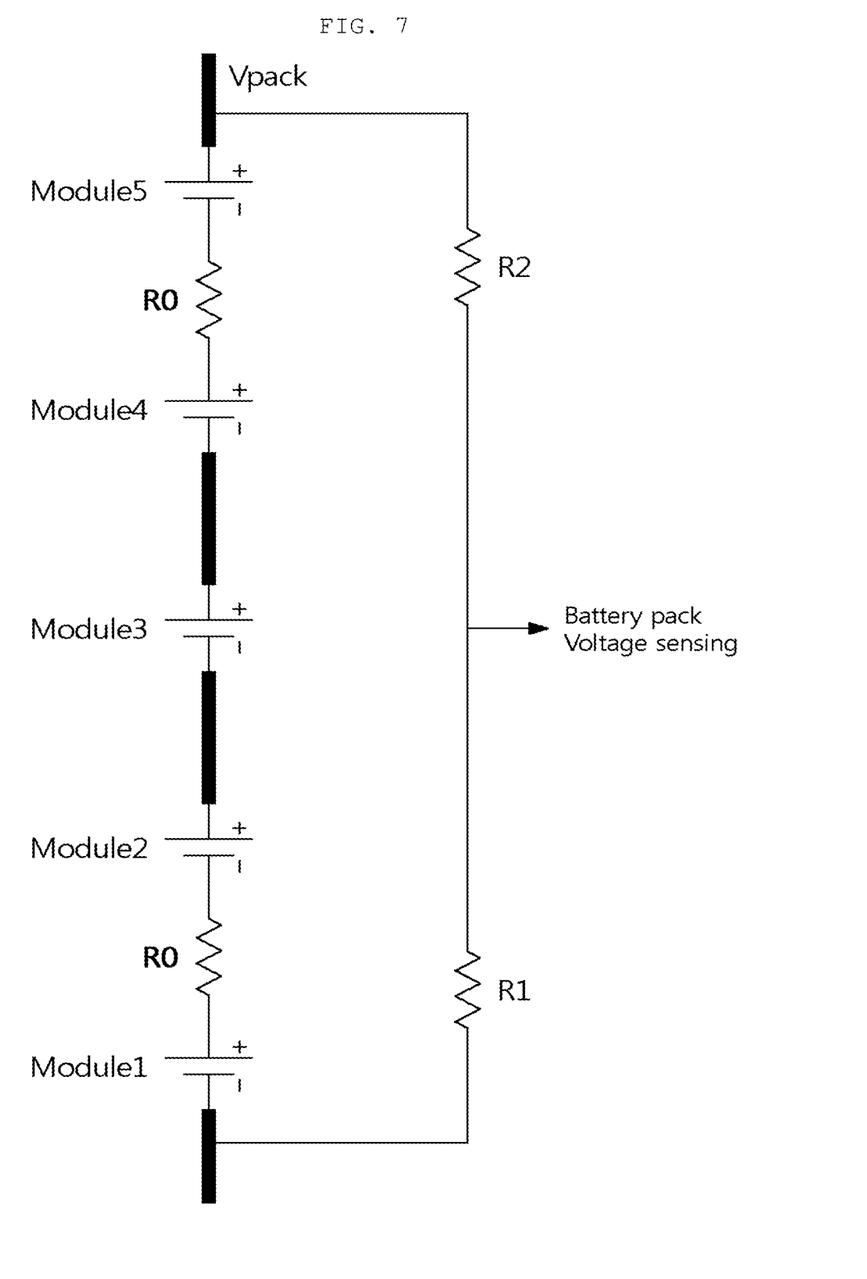
FIGS. 7 and 8 illustrate other voltage sensing examples for the busbar opened state.
Figure 8:
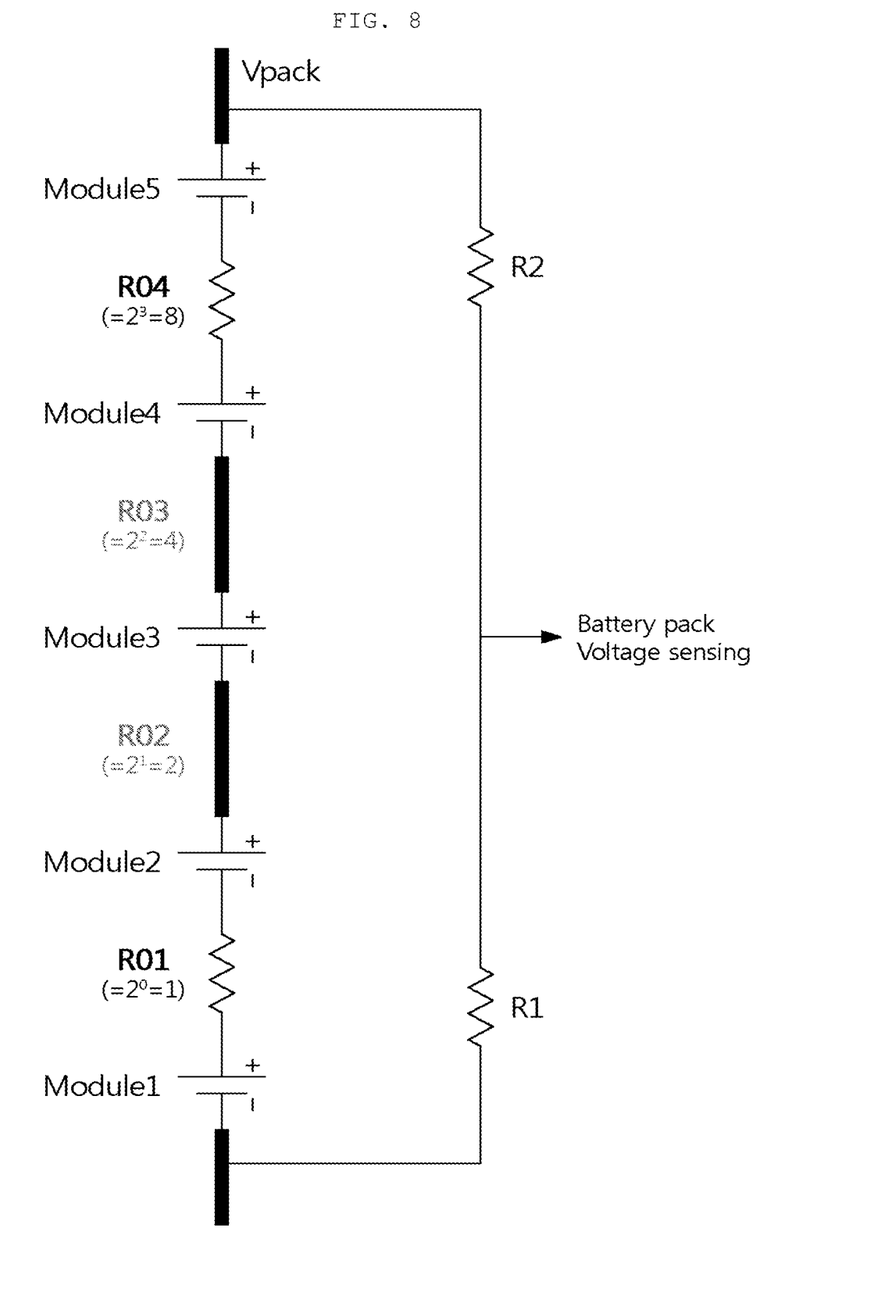

FIGS. 7 and 8 illustrate other voltage sensing examples for the busbar opened state, and a more generalized voltage value calculation equation for detecting an opening of a busbar will be described with reference to FIGS. 7 and 8. FIGS. 7 and 8 correspond to a case in which the module assembly includes five modules and four busbars, and particularly, correspond to an example in which two busbars of the four busbars are opened. In this case, FIG. 7 is an example in which the protective resistors corresponding to busbar opened positions all have the same resistance value and FIG. 8 is an example in which the protective resistors have different resistance values for each of the positions.

First, in a case in which the protective resistors all have the same resistance value and the two busbars of the four busbars are opened as in the example of FIG. 7, the voltage value sensed in the voltage detection circuit is Vpack*R1/(R1+R2+2R0). In general, when the number of opened busbars of the busbars included in the module assembly is n and the resistance values of the protective resistors are the same as each other, the voltage value sensed in the voltage detection circuit is Vpack*R1/(R1+R2+nR0). That is, it is possible to detect not only whether or not the busbar is opened, but also how many busbars are opened using the voltage value sensed in the voltage detection circuit. However, in this case, it is difficult to detect which position of the busbar is opened.

Next, in a case in which the protective resistors have different resistance values and the two busbars of the four busbars are opened as in the example of FIG. 8, the voltage value sensed in the voltage detection circuit is Vpack*R1/(R1+R2+(R01+R04))). In general, when at least some of the busbars included in the module assembly are opened, the voltage value sensed in the voltage detection circuit is Vpack*R1/(R1+R2+ΣR0). ΣR0: a sum of the resistance values of the protective resistors corresponding to the busbar opened positions.

In this case, in a case in which the resistance values of the protective resistors are set to different values that may be distinguished, it is possible to detect not only whether or not the busbar is opened, but also how many busbars are opened at which position using the voltage sensed in the voltage detection circuit. For example, the resistance values of the protective resistors may be sequentially determined as a value of digit of a binary number by defining the resistance values as a geometric sequence having a geometric ratio of 2. That is, a resistance value of R01 is determined as $2^1$R=1R ohm, a resistance value of R02 is determined as $2^1$R=2R ohm, a resistance value of R03 is determined as $2^2$R=4R ohm, and so on. In this state, a value of ΣR0 may be calculated inversely from the voltage value sensed in the voltage detection circuit. Here, when the value of ΣR0 is transformed to binary number*R, it may be seen that the busbar is opened at a position corresponding to the digit at which 1 is generated. For example, in the example of FIG. 8, the resistance value of R01 is $2^0$R=1R ohm, the resistance value of R04 is $2^3$R=8R ohm, and the value of ΣR0 is 9R. If the resistance value is transformed to the binary number*R, 1001*R is generated, and it may be seen that the busbars of first and fourth digits from the anode of the module assembly are opened.

That is, in summary, when the order of the protective resistors is sequentially 1, . . . , N from the anode side of the module assembly to the cathode side thereof, in a case in which the resistance value of an N-th protective resistor is determined to be $2^{N-1}$R, it may be determined that the busbars of digits at which 1 is generated when the value of ΣR0 calculated from the voltage value sensed in the operation of sensing the voltage value is transformed to the binary number*R are opened. This is merely one example, and although the resistance value is not necessarily determined with respect to the digits of the binary number, several other methods may be applied, such as using a similar method, for example, a hexadecimal number.

According to the present invention, in the case in which the plurality of unit batteries each including the balancing circuit are connected in series with each other by the busbar, it is possible to very effectively prevent the reverse voltage generated when the busbar is opened. In detail, in the conventional circuit, the high current that needs to originally flow to the busbar when the busbar is opened flows to the balancing circuit, thereby causing the damage, and the reverse voltage is formed accordingly, thereby causing serious damage on the battery management board. According to the present invention, however, the reverse voltage is prevented by preventing the current from flowing to the balancing circuit when the busbar is opened, thereby making it possible to essentially prevent the occurrence of damage in both the balancing circuit and the battery management board.

As well, according to the present invention, as the battery pack includes the busbar connection state protection circuit, different voltage values are sensed in the normal state and the busbar opened state even when the voltage is sensed using the voltage detection circuit, thereby making it possible to effectively detect whether or not the opening of the busbar occurs.

The present invention is not limited to the above-mentioned exemplary embodiments but may be variously applied, and may be variously modified by those skilled in the art to which the present invention pertains without departing from the gist of the present invention claimed in the claims.

What is claimed is:

1. A battery pack comprising:
   a plurality of modules including a unit battery which is coupled in parallel to a balancing circuit;
   a busbar coupling two adjacent ones of the plurality of modules in series; and
   a resistor coupled in parallel to the busbar,
   wherein one terminal of the busbar is coupled to a cathode of one module of the two adjacent modules and another terminal of the busbar is coupled to an anode of another module of the two adjacent modules, wherein one terminal of the resistor is coupled to one terminal of the balancing circuit coupled to the cathode of one module and another terminal of the resistor is coupled to another terminal of the balancing circuit coupled to the anode of another module, and wherein, when the busbar is opened, the battery pack is formed so that electricity flows from the cathode of one module to the anode of the other adjacent module through the resistor.

2. The battery pack of claim 1, wherein when a plurality of resistors are provided, resistance values of the respective resistors are formed to be equal to each other or are formed to be different from each other.

3. The battery pack of claim 1, wherein the resistor is configured to determine whether or not the busbar is opened.

4. A method for detecting whether or not a busbar is opened using the battery pack of claim 1, the method comprising:
   an operation of connecting a voltage detection circuit of connecting both terminals of a module assembly in which the plurality of modules are connected in series with each other, and both terminals of a first resistor and a second resistor which are connected in series with each other to each other;
   an operation of sensing a voltage value of sensing the voltage value between the first resistor and the second resistor; and
   an operation of determining whether or not a busbar is opened of determining whether or not the busbar is opened using the voltage value sensed in the operation of sensing the voltage value.

5. The method of claim 4, wherein in the operation of determining whether or not the busbar is opened, when the first resistor is disposed at an anode side of the module assembly and the second resistor is disposed at a cathode side of the module assembly, it is determined that the busbar is normally connected when the voltage value sensed in the operation of sensing the voltage value satisfies:

$$V = V\text{pack} * R1/(R1+R2)$$

(where, V: the sensed voltage value, Vpack: a sum of voltage values across each of the modules included in the module assembly, R1: a resistance value of the first resistor, and R2: a resistance value of the second resistor).

6. The method of claim 4, wherein in the operation of determining whether or not the busbar is opened, when the first resistor is disposed at an anode side of the module assembly, the second resistor is disposed at a cathode side of the module assembly, and at least some of the busbars included in the module assembly are opened, it is determined that the busbar is opened when the voltage value sensed in the operation of sensing the voltage value satisfies:

$$V = V\text{pack} * R1/(R1+R2+\Sigma R0)$$

(where, V: the sensed voltage value, Vpack: a sum of voltage values across each of the modules included in the module assembly, RI: a resistance value of the first resistor, R2: a resistance value of the second resistor, and £R0: a sum of resistance values of the protective resistors corresponding to busbar opened positions).

7. The method of claim 6, wherein in the operation of determining whether or not the busbar is opened,
   when the order of the protective resistors is sequentially 1, ..., N from the anode side of the module assembly to the cathode side thereof, a resistance value of an N-th protective resistor is determined to be $2^{N-1}R$, and
   it is determined that the busbars of digits at which 1 is generated when the value of $\Sigma R0$ calculated from the voltage value sensed in the operation of sensing the voltage value is transformed to the binary number*R are opened.

* * * * *

UNITED STATES PATENT AND TRADEMARK OFFICE
CERTIFICATE OF CORRECTION

PATENT NO. : 11,121,411 B2
APPLICATION NO. : 15/889417
DATED : September 14, 2021
INVENTOR(S) : Kyu Min Hwang Page 1 of 1

It is certified that error appears in the above-identified patent and that said Letters Patent is hereby corrected as shown below:

In the Claims

Column 9, Line 8, Claim 1, delete "wherein," and insert -- wherein --

Column 10, Line 22, Claim 6, delete "RI:" and insert -- R1: --

Column 10, Line 23, Claim 6, delete "£R0:" and insert -- $\sum$R0: --

Signed and Sealed this
Fourteenth Day of December, 2021

Drew Hirshfeld
*Performing the Functions and Duties of the*
*Under Secretary of Commerce for Intellectual Property and*
*Director of the United States Patent and Trademark Office*